Nov. 3, 1970 HISAYOSHI YANAI ET AL 3,538,400

SEMICONDUCTOR GUNN EFFECT SWITCHING ELEMENT

Filed July 30, 1968 7 Sheets-Sheet 1

INVENTORS
HISAYOSHI YANAI
TOSHIAKI IKOMA
TAKAYUKI SUGETA
YASUO MATSUKURA
KUNIICHI OHTA

BY Hopgood & Calimafde
ATTORNEYS

Nov. 3, 1970 HISAYOSHI YANAI ET AL 3,538,400

SEMICONDUCTOR GUNN EFFECT SWITCHING ELEMENT

Filed July 30, 1968 7 Sheets-Sheet 2

INVENTORS
HISAYOSHI YANAI
TOSHIAKI IKOMA
TAKAYUKI SUGETA
YASUO MATSUKURA
KUNIICHI OHTA

BY Hopgood & Calimafde
ATTORNEYS

SEMICONDUCTOR GUNN EFFECT SWITCHING ELEMENT

INVENTORS
HISAYOSHI YANAI
TOSHIAKI IKOMA
TAKAYUKI SUGETA
YASUO MATSUKURA
KUNIICHI OHTA
BY
Hopgood & Calimafde
ATTORNEYS INVENTORS
HISAYOSHI YANAI
TOSHIAKI IKOMA
TAKAYUKI SUGETA
YASUO MATSUKURA
KUNIICHI OHTA
BY
Hopgood & Calimafde
ATTORNEYS INVENTORS
HISAYOSHI YANAI
TOSHIAKI IKOMA
TAKAYUKI SUGETA
YASUO MATSUKURA
KUNIICHI OHTA BY Hopgood & Calimafde
ATTORNEYS Nov. 3, 1970 HISAYOSHI YANAI ET AL 3,538,400

SEMICONDUCTOR GUNN EFFECT SWITCHING ELEMENT

Filed July 30, 1968 7 Sheets-Sheet 6

INVENTORS
HISAYOSHI YANAI
TOSHIAKI IKOMA
TAKAYUKI SUGETA
YASUO MATSUKURA
KUNIICHI OHTA

BY Hopgood & Calimafde
ATTORNEYS

SEMICONDUCTOR GUNN EFFECT SWITCHING ELEMENT

Filed July 30, 1968 7 Sheets-Sheet 7

INVENTORS
HISAYOSHI YANAI
TOSHIAKI IKOMA
TAKAYUKI SUGETA
YASUO MATSUKURA
KUNIICHI OHTA
BY
Hopgood & Calimafde
ATTORNEYS

United States Patent Office 3,538,400
Patented Nov. 3, 1970

3,538,400
SEMICONDUCTOR GUNN EFFECT SWITCHING ELEMENT

Hisayoshi Yanai, Toshiaki Ikoma, Takayuki Sugeta, Yasuo Matsukura, and Kuniichi Ohta, Tokyo, Japan, assignors to Nippon Electric Company, Limited, Tokyo, Japan Filed July 30, 1968, Ser. No. 748,719
Claims priority, application Japan, July 31, 1967, 42/49,213
Int. Cl. H01l *11/00*
U.S. Cl. 317—235 5 Claims

ABSTRACT OF THE DISCLOSURE

A bulk effect semiconductor device is described. The semiconductor crystal is selectively chosen to be capable of exhibiting the Gunn effect and is further chosen in such manner as to shape or resistivity that upon the application of a biasing voltage, a low electric field portion and a high electric field portion is formed with the high field being chosen to exceed the high field domain sustaining level without exceeding the level for establishing steady Gunn effect oscillations and the low electric field has a level below that necessary to sustain a high field domain. A triggering electrode is capacitively coupled to the low electric field portion of the semiconductor crystal. An output electrode is also capacitively coupled to the crystal in one embodiment to the high electric field portion thereof and in another embodiment to the low electric field portion of the crystal.

Several crystal shapes and types are described.

This invention relates to a semiconductor switching element utilizing the characteristics of the electric dipole layer of high electric field (hereinafter called "high field domain") in the same way as in the Gunn diode.

Up to date, there have been proposed several switching elements such as the PN junction diode, the transistor, the Schottky diode, etc. By using these elements, however, the switching time as well as the pulse duration cannot be shortened below subnanoseconds. The Gunn diode is an active element based on the principle that, by applying a high electric field on a single crystal of gallium arsenide, the high field domain quickly grows in the semiconductor crystal in the close vicinity of the cathode of the element and propagates toward the anode. It has been found that keeping the electric field $F_l$ valued between the threshold field $F_{th}$ (which is defined as the minimum electric field intensity necessary to excite the high field domain) and the sustaining field $F_s$ (which is defined as the minimum electric field intensity necessary to sustain the high field domain once generated by the triggering pulse and which satisfies the relation $F_s<F_{th}$), and then impressing a triggering pulsed electric field on the control electrode which is coupled to the diode via the capacitor coupling, ohmic direct coupling, etc., a high field domain can be formed and caused to propagate toward the anode until it disappears at the anode. The device of this kind is useful as a high speed logic element.

According to an example of this technique published in the "Electronic Materials" (in Japanese), May 1967, pp. 20–24, "U.S. Pat. No. 3,365,583," issued to I.B.M. Corp. and "Microwave Semiconductor Devices and Their Circuit Applications," Chapter 16, published by McGraw-Hill Book Co., the high field domain can be easily generated or extinguished by the polarity of the impressed voltage to the input electrode, and the current waveform flowing through the sample can be optionally changed by varying the cross section and the electron density of the sample.

The semiconductor element utilizing the formation of high field domain is superior as an element in the extra-high frequency and the high-speed pulse compared with the hitherto-used PN junction element, Schottky diode, etc. in respect of low noise, high speed and high output power and simplicity of the structure, though it lacks practicability due to the immature techniques in the preparation of the sample as well as in the means of providing the input electrodes or the output electrodes. Especially, in the cases where the input electrodes are provided on the diode, the device may not work properly as a switching element, due to a feedback action occurring from the signal upon the passage of the high field domain just below the electrode. This gives an undesirable effect on the switching element provided with multi-electrodes such as input electrodes or output electrodes.

The object of this invention is therefore to provide a semiconductor switching element having highly reliable operation, with the supplementary electrodes free from the feedback coming from the high field domain.

FIG. 1 is an electric field vs. excess voltage characteristic curves for explaining the formation of the electric dipole layer of high electric field;

FIGS. 2(A) through 2(B) are plan views and a circuit diagram in which the present element is shown by a longitudinal cross-sectional view for explaining the first embodiment of this invention;

Figure 8:
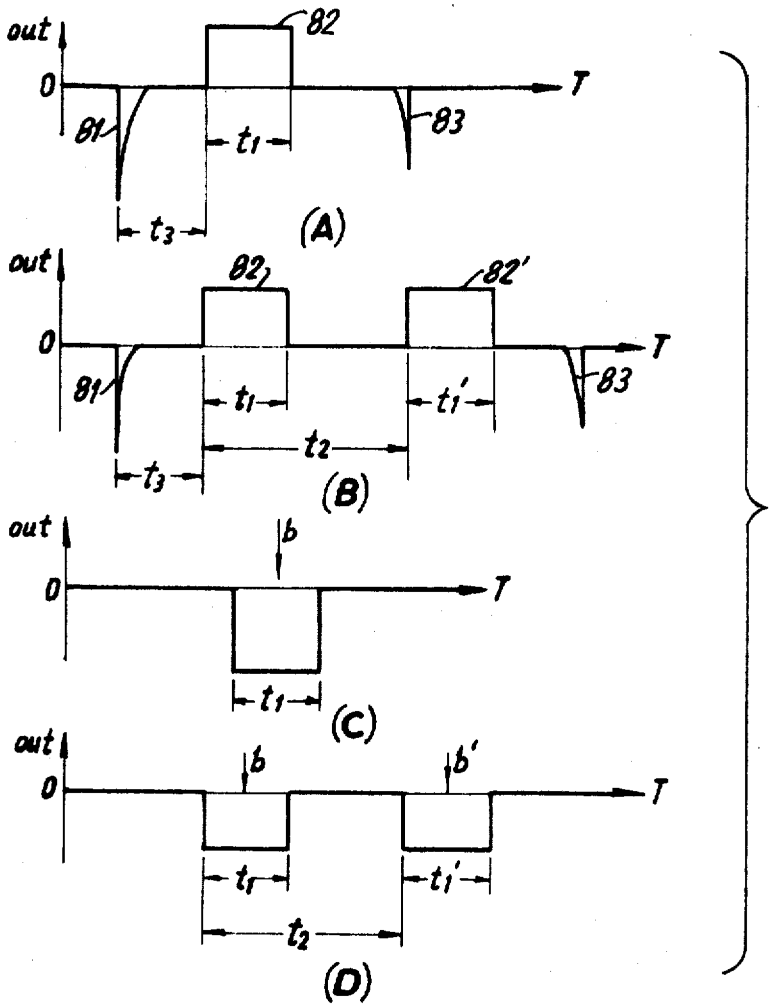
Figure 10:
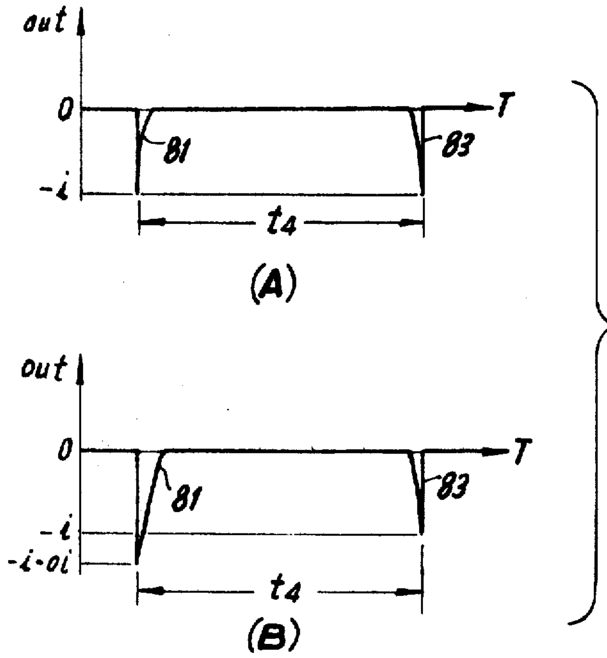
Figure 9:
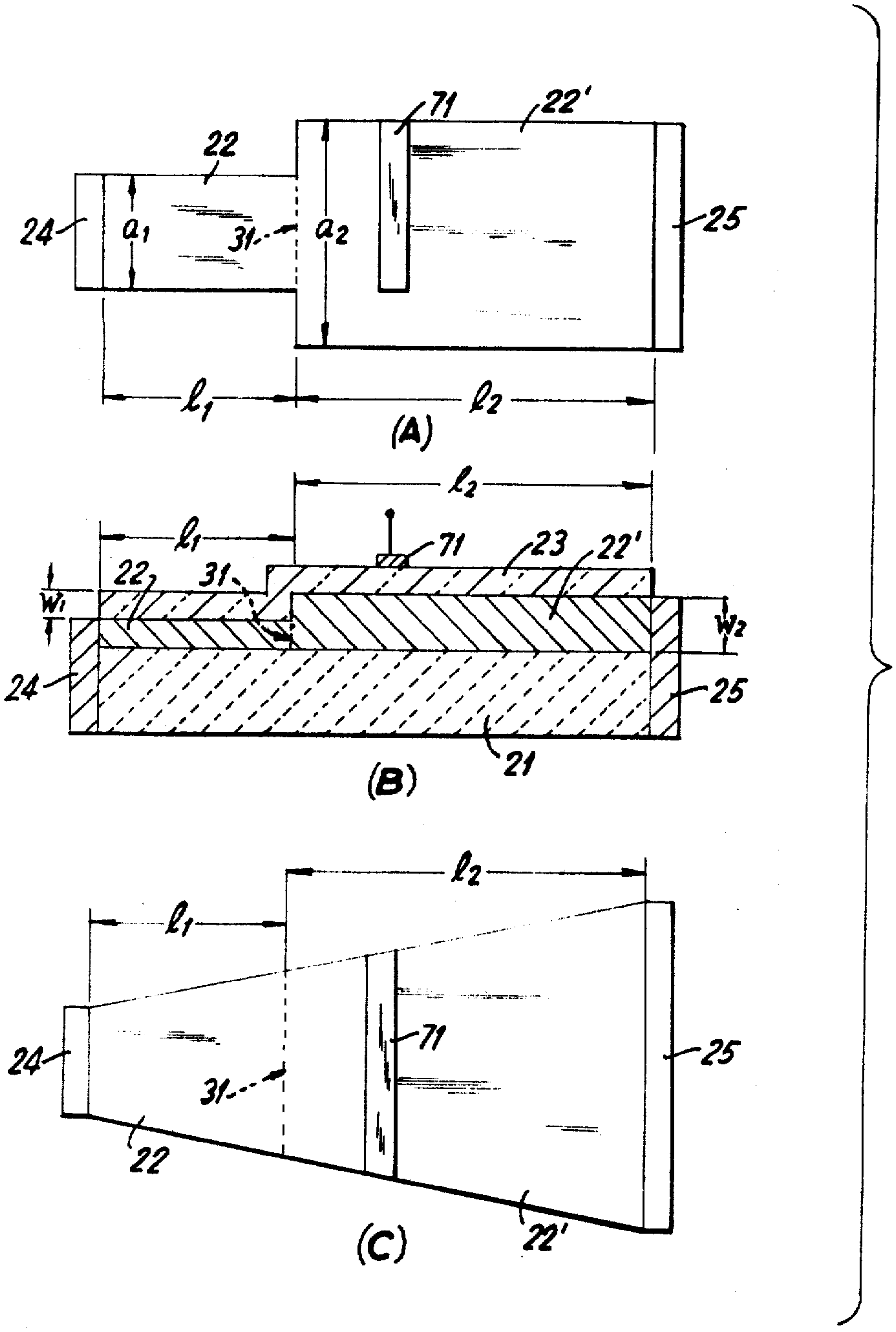
Figure 9:
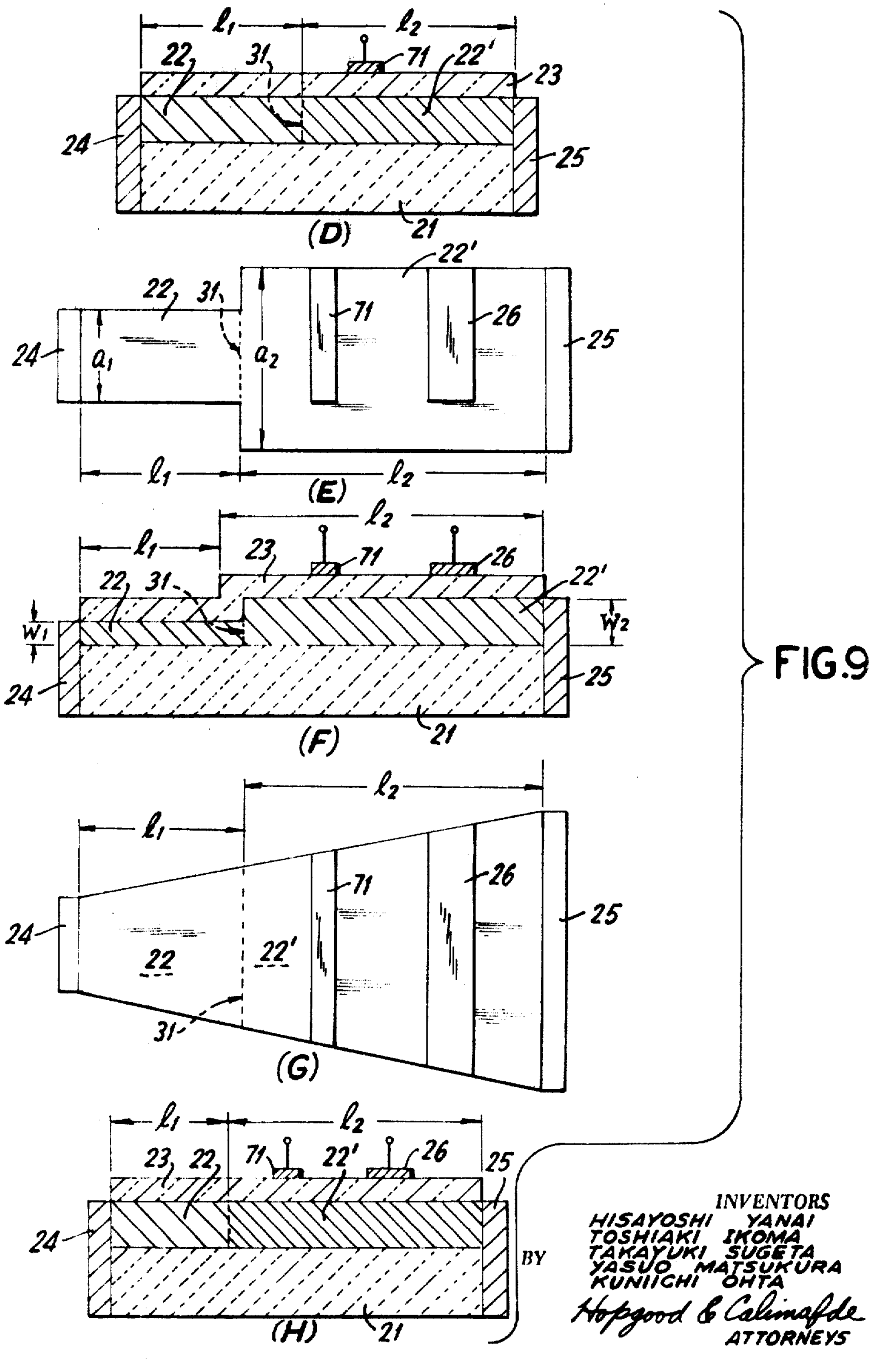

FIGS. 7(A) through 7(E) are plan views, a circuit diagram in which the present element is shown by a longitudinal cross-sectional view and longitudinal cross-sectional views for explaining the second embodiment of this invention;

FIG. 8 shows the input and output waveforms of the second embodiment;

FIGS. 9(A) through 9(H) are plan views and longitudinal cross-sectional views for explaining the third embodiment of this invention; and FIG. 10 shows the input and output waveforms obtained by the third embodiment.

According to this invention, it is possible to obtain a semiconductor switching element wherein a semiconductor exhibits the bulk negative differential conductance and has the structure with at least two parts, whose cross sectional resistivities are different from one another, i.e. each of the parts has a different cross sectional area or different carrier densities. A supplementary electrode is provided on the surface of one of the parts of smaller resistivity, large cross section or larger carrier density, and the electric field at the part under the said supplementary electrodes is kept below the level for sustaining the high field domain to extinguish it at the boundary of said two parts before it reaches the supplementary electrodes so as to prevent the feedback action.

In the semiconductor switching element of this invention, the high field domain formed at the semiconductor crystal part where the cross section or the carrier density is small does not pass under the supplementary electrodes so that there is no effect of the high field domain on the supplementary electrodes and the device works well free from the error because of the prevention of the feedback action.

Now, an explanation will be given, referring to the drawings, for better understanding of this invention.

The reason why the high field domain known as a Gunn effect, is formed lies in that the conduction band of the gallium arsenide crystal has a minimum with small effective mass as well as subminima with large effective mass and higher energy, and the electrons are accelerated by the high electric field so that there takes place a redistribution of the electrons in these two upper and lower minima. This mechanism of Gunn effect is described in "Microwave Semiconductor Devices and Their Circuit Applications," Chapter 16, published by McGraw Hill Co. More particularly, when the electrons are accelerated by the high electric field to become "hot," the average velocity of them becomes strongly dependent on the electric field due to the strong dependence of the electron temperature on the electric field. The increase in the electric field intensity causes the number of electrons in the upper subbands of large effective mass to increase, resulting in the appearance of an electric field region exhibiting a negative differential conductivity. As a result, a local high field domain appears under certain proper conditions and propagates in the crystal until it disappears. The mechanism of the Gunn effect in gallium arsenide entirely originates with the behavior of such a high field domain. When a high electric field is impressed in a gallium arsenide crystal of rectangular solid form, there is a relation between the excess domain voltage $V_d$ and the electric field $F_l$ in the low electric field part such that $$V_d = V - F_l L$$

where V is the voltage impressed across the sample, and L is the length of the sample. On the other hand, there is a unique relation for the gallium arsenide between $V_d$ and $F_l$ which is determined by the specific resistance only.

Figure 1:
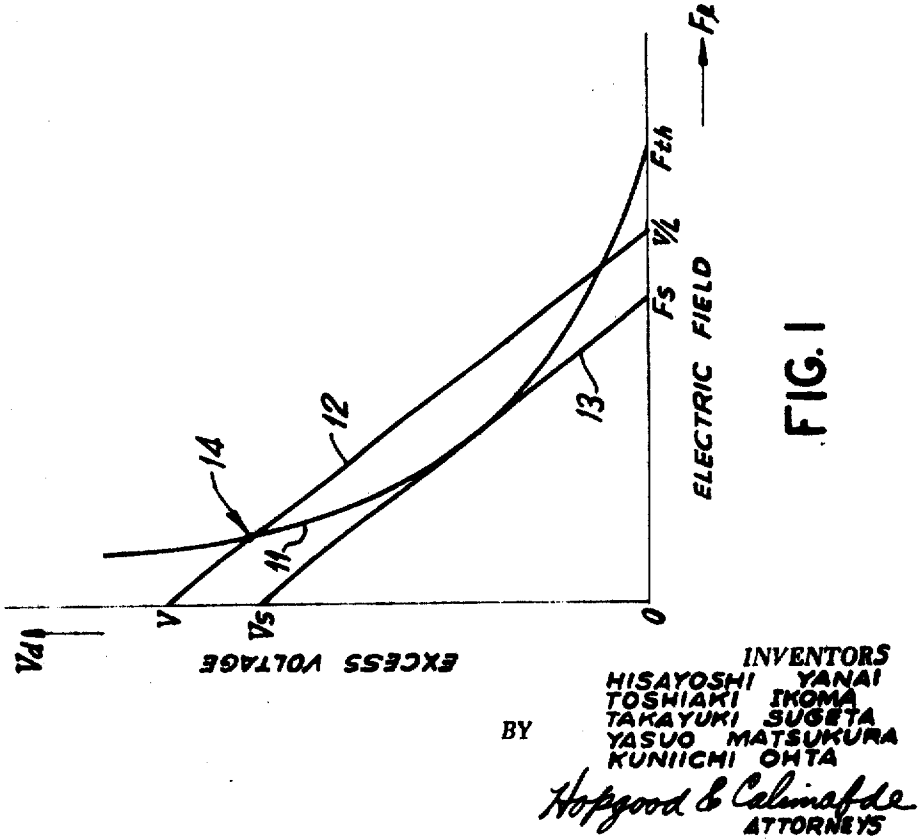

Referring to FIG. 1 in which the low electric field $F_l$ is plotted along the abscissa and the excess domain voltage $V_d$ is plotted along the ordinate, the relation between the electric field inherent to the specific resistivity and the domain voltage is shown by curve 11, and the domain voltage $V_d$ against the applied voltage to the crystal V is given by the load line 12. Curve 11 has a threshold value $F_{th}$ for generating the high field domain at $V_d = 0$. If the applied electric field is larger than the threshold value $F_{th}$, the formation of the high field domain in the vicinity of the cathode and its disappearance at the anode are repeated so that the oscillation of microwave frequency region is obtained. The load line 13 tangential to the Curve 11 gives the minimum value $V_d$ or $F_l$ (which is designated as $V_s$ and $F_s$ respectively in the FIG. 1) needed for sustaining the high field domain once formed in the crystal in which this high field domain has been generated by a certain means, and the applied voltage at that time shows the minimum sustaining voltage $V_s$ and the minimum sustaining electric field $F_s$. Therefore, when the impressed voltage V is given so as to make the inner electric field $V/L$ become between the minimum sustaining electric field $F_s$ and the threshold value $F_{th}$, the crystal does not generate the high field domain in such a state, but, by applying further a triggering electric field from outside of the device, the inner electric field is raised beyond the threshold electric field $F_{th}$ and the high field domain can be formed. The response time under this condition is very short corresponding to the growth time for the high field domain, amounting to the order from $10^{-11}$ to $10^{-12}$ sec. Conversely, when the electric field of the low electric field region near the high field domain is lowered below the sustaining electric field $F_s$ by applying a triggering voltage in the opposite direction from outside as a trigger, it is possible to extinguish the high field domain.

Referring to FIGS. 2(A) and (B), according to the first embodiment of this invention, a substrate 21 of high insulating gallium arsenide crystal of rectangular parallelipiped with 500$\mu$ in length L, 50$\mu$ and 100$\mu$ respectively in widths $a_1$ and $a_2$, and 300$\mu$ in thickness, and having specific resistance of several hundred kiloohms, supports the first and the second crystals of n-type gallium arsenide 22 and 22' as the epitaxial layers containing tellurium in the order of $10^{15}$ cm.$^3$ as impurity at a thickness of 15$\mu$ formed by the epitaxial process, on which an additional insulating thin film 23 of silicon oxide is attached to the epitaxial layer by a thickness of 2000 A. A cathode 24 and an anode 25 are contacted ohmically to the crystals 22, 22' respectively, and thus a sample is formed which is provided with input electrodes 26 obtained by the vapor deposition of aluminum selectively on the silicon oxide film 23 attached to the second part 22' of the epitaxial layer with wide cross-sectional area.

A load 27 and an electric power source 28 are connected between the cathode 24 and the anode 25, and an electric power source 29 as a source of input signal and a switching means 30 are connected in series between the aluminum electrodes 26 and the cathode 24. In this case, as the substrate 21 serves as an excellent insulator, almost all current flows through the N-type crystals 22, 22'. By adjusting the voltage supplied from the power source 28, the electric field in the first crystal 22 having the width $a_1$ becomes larger than the sustaining electric field $F_s$ and smaller than the threshold value $F_{th}$ so as to be under the condition given by the line 12 in FIG. 1, but the electric field of the second crystal 22' having the width $a_2$ is kept under the condition that it is smaller than the sustaining electric field $F_s$.

Figure 2:
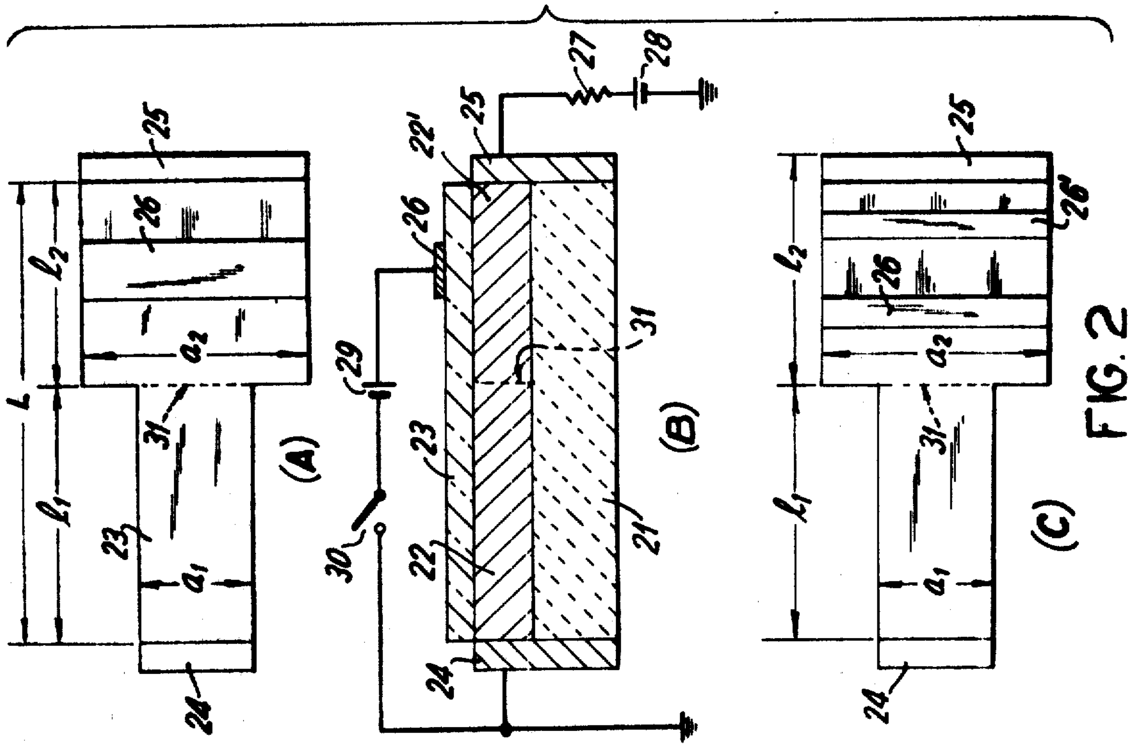

On closing a switch 30, the potential just under the input electrode 26 in the crystal is raised instantaneously, and then the electric fields in the semiconductor region between cathode 24 and the second crystal 22' under the electrode 26 are increased. The electric power source 29 is previously adjusted so that the value of the increased electric field in the first crystal 22 between the cathode 24 and the boundary surface 31, becomes larger than $F_{th}$ in FIG. 1. In this case a high field domain is produced in the close vicinity of the cathode 24 in the crystal 22, the high field domain propagates in the first crystal 22 in the direction of the anode 25, and the second crystal whose electric field is smaller than the sustaining electric field $F_s$ disappears when the high field domain reaches the boundary surface 31. Namely, when the high field domain is generated, the working point is shifted from a point $V/L$ to the intersecting point 14 in FIG. 1, and even when the potential just under the input electrode 26 is lowered to the original value by opening the switch 30, the high field domain would not disappear. In this way, as shown in FIG. 2, by providing the input electrode 26 on the insulating thin film 23 and by applying a trigger pulse from the power source 29 and the switch 30, is it possible to generate the high field domain which propagates to the anode 25 before it disappears. In this embodiment the above-mentioned action is feasible with the applied voltage of 105 volts between the cathode 24 and the anode 25 and the voltage of the power source 29 of 20 volts.

When the high field domain is generated in the first crystal 22, the current flowing in each of the crystals 22 and 22' is decreased. This change in the current can be taken out by the voltage across the load 27. If the structure of the diode and the external circuit as shown in FIG. 2(B) are used, the pulse width $t$ of the current waveform passing through the load 27 is given by $$t = l_1/v$$

where $l_1$ is the length of the region having the width $a_1$ as shown in FIG. 2(A), and $v$ is the drift velocity (about $10^7$ cm./sec.) of the high field domain. Hence the pulse width $t$ is 2.5 nanosecond for this sample. On the other hand, the rise time of pulse is nearly equal to the rise time of the high field domain depending on the carrier density and being of the order of $10^{-11}$–$10^{-12}$ sec., so that an extra-high-speed switching device is feasible.

The above explanation is directed to the case of one input electrode. In the case of multiple input electrodes capacitively coupled with the active region via the insulating film 23 as shown in FIG. 2(C), it is possible to obtain a similar switching action as mentioned above, as well as a variety of applications. One example is an "OR" circuit, in which each of electrodes 26 and 26' can form the high field domain in the first crystal 22 by applying a trigger pulse, provided that the interval of the trigger is larger than $t=l_1/v$.

Referring to FIGS. 3(A) through (D) in which the input or output voltage $V_{in}$, $V_{out}$ are taken along the ordinate and the time along the abscissa, the relation between the input signal given to the input electrode 26 in FIG. 2 and the waveform of the output obtained from the load 27, can yield the output waveforms of FIGS. 3(B) and (D) for the input waveforms of FIGS. 3(A) and (C), respectively.

Since the rise time of the pulse of FIG. 3(B) is nearly equal to the growth time of the high field domain, that is, of the order of $10^{-11}$–$10^{-12}$ sec., it is possible to produce a pulse whose rise time is of the order of $10^{-11}$–$10^{-12}$ sec. by applying a trigger such as of FIG. 3(C) to the input electrode 26 of FIG. 2. Also in this case the pulse width $t$ is determined by $l_1/v$ while the repetition time $t'$ corresponds to the repetition time $t'$ of the trigger.

Figures 3, 4, 5, 6:
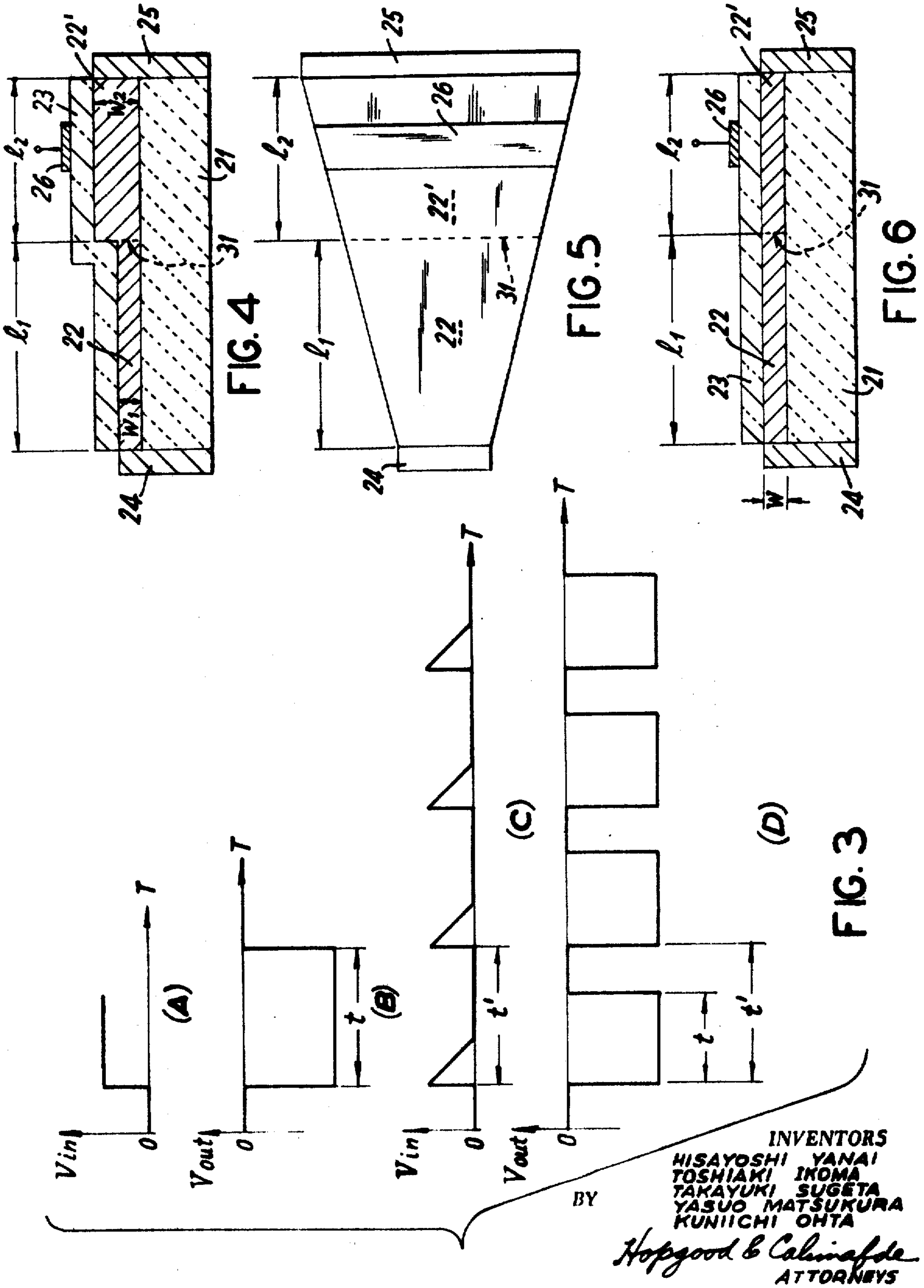
FIG. 3 shows the input and output waveforms of the first embodiment.
FIGS. 4 through 6 are a plan view and longitudinal cross-sectional views for explaining the modifications of the first embodiment.

In an element having the structure shown in FIG. 4 which is a modification of the first embodiment shown in FIGS. 2(A) and (B), just the same function as in the element of FIGS. 2(A) and (B) can be obtained. The first crystal 22 of the active region consists of gallium arsenide with length $l_1$ and thickness $W_1$ and the second crystal 22' consists of a gallium arsenide with length $l_2$ and thickness $W_2$, both being of the same width $a$. By adjusting in advance the electric field in the domain of the first crystal 22 to be larger than $F_s$ and smaller than $F_{th}$ and the electric field in the domain of the second crystal 22' to be smaller than $F_s$, it becomes possible to make the above element produce the waveforms of $t=l_1/v$ as shown in FIGS. 3(B) and (D), by applying a trigger of FIG. 3(A) to the input electrode 26 and thereby forming a high field domain at the cathode 24 and making it disappear at the boundary face 31.

Further, the similar action to that obtained from the element of FIGS. 2(A) and (B) can also be realized by the element whose plan view is shown in FIG. 5. The crystals 22 and 22' are respectively composed of a gallium arsenide of the same thickness W covered with an insulating thin film, the width being so tapered as to form a trapezoid as shown in the FIG. 5. The part of the first crystal 22 has a length $l_1$ in which the electric field intensity is higher than the sustaining electric field $F_s$ of the high field domain and smaller than the threshold field $F_{th}$ for exciting the high field domain, while the part of the second crystal 22' has a length $l_2$ and the electric field has been adjusted so as to be smaller than the sustaining electric field $F_s$ of the high field domain by the electric power source for the cathode 24 and the anode 25. In this element, the electric field distribution becomes weaker gradually from the cathode 24 to the anode 25. By adjusting the applied voltage to the cathode 24 and the anode 25, the boundary face 31 of each of the crystals 22 and 22' is variable. By working with the external circuit of FIG. 2(B), the waveforms of FIGS. 3(B) and (D) can be obtained. In this case also, the pulse width $t=l_1/v$ and, therefore, the pulse width can be modulated by changing the applied voltage.

In the examples so far described referring to FIGS. 2, 4 and 5, the shifting region of the formed high field domain has been controlled by changing the geometrical structure of the semiconductor crystal, while in the sample shown in FIG. 6, the control over the high field domain can be achieved by forming in the sample wherein each of the first and second crystals 22 and 22' has a different carrier density to the other. The crystals 22 and 22' have the same width $a$ and the same thickness W, but the carrier density is $10^{13}$–$10^{16}$ cm.$^3$ in the first crystal 22 and that of the second crystal 22' being greater than $10^{17}$ cm.$^3$. By adjusting the load and the power source in such a way that the electric field in the first crystal 22 is smaller than the threshold value $F_{th}$ and larger than the sustaining electric field $F_s$ and that the electric field in the second crystal 22' is smaller than the sustaining electric field $F_s$, it is possible to make the high field domain that has been formed in the vicinity of the cathode 24 by applying a trigger pulse through the input electrode 26 propagate only through the first crystal 22 and disappear at the boundary surface 31. Such a carrier distribution can be obtained either by the selective diffusion of impurities in the second crystal 22' or by the selective growth to make the second crystal 22' contain impurities to the extent of more than $10^{17}$ cm.$^3$. The use of such a sample enables us to obtain the waveforms of FIGS. 3(B) and (D) by applying the triggers of FIGS. 3(A) and (C) respectively to the input electrode 26. In these cases the pulse width $t=l_1/v$ is obtained. As mentioned in the above several examples, the high field domain does not pass through the semiconductor crystal region 22' under the input electrode 26 in either case. Therefore the device would not form a feedback signal to the input circuit $a$ produced when the high field domain passes under the input electrode.

Referring to FIGS. 7(A) through (E) and according to the second embodiment of this invention, it is possible to obtain a shorter output pulse from the sample than that obtained in the former embodiment by providing output electrodes 71 and 71' on the first crystal 22 of the samples shown in FIG. 2 and FIGS. 4 through 6. Namely, in the structure of the sample and the circuit shown in FIGS. 7(A) and (B), the output circuit composed of the output electrodes 71 and 71' and the output resistance 21 is added to the structure shown in FIGS. 2(A) and (B).

Figure 7:
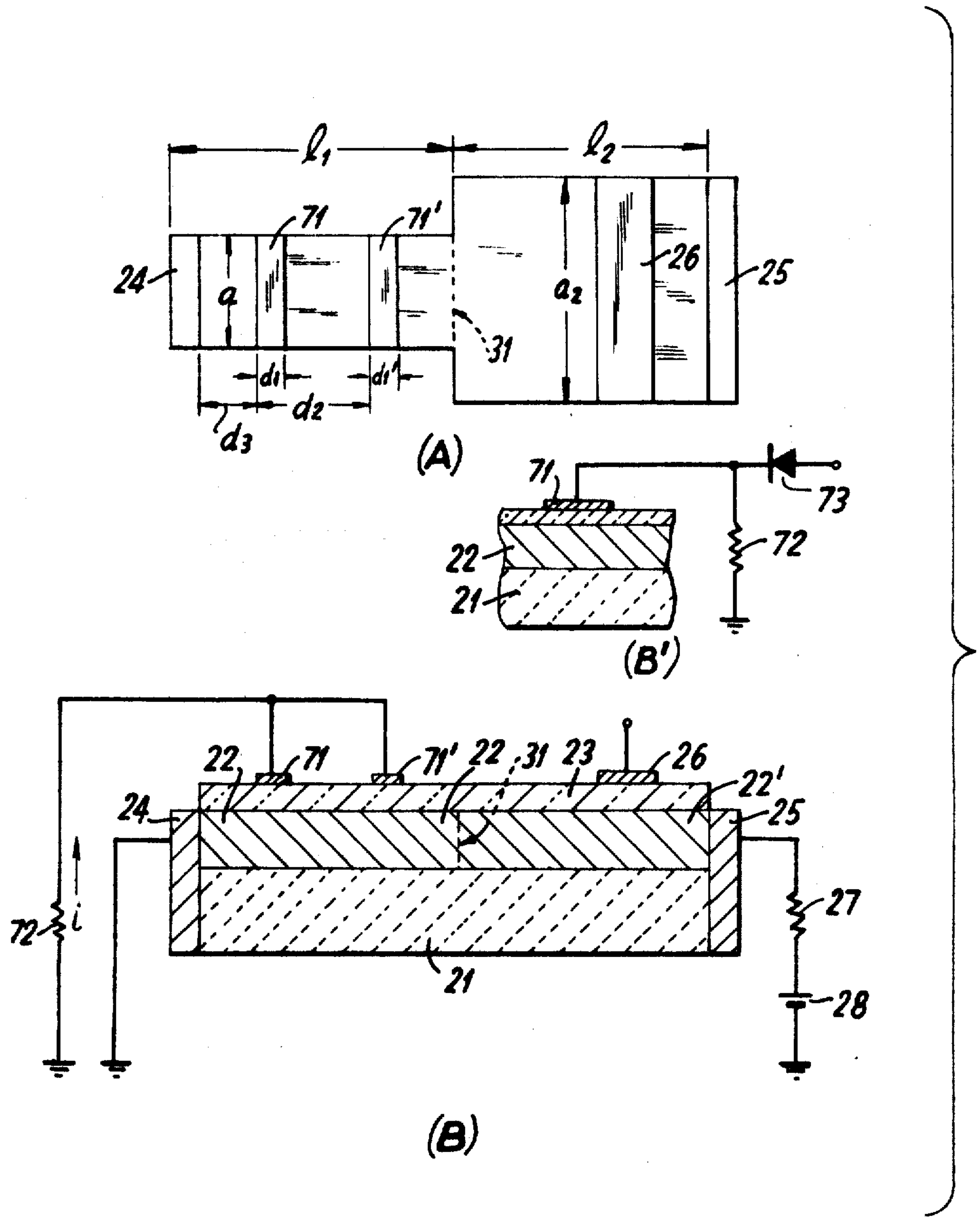
Figure 7:
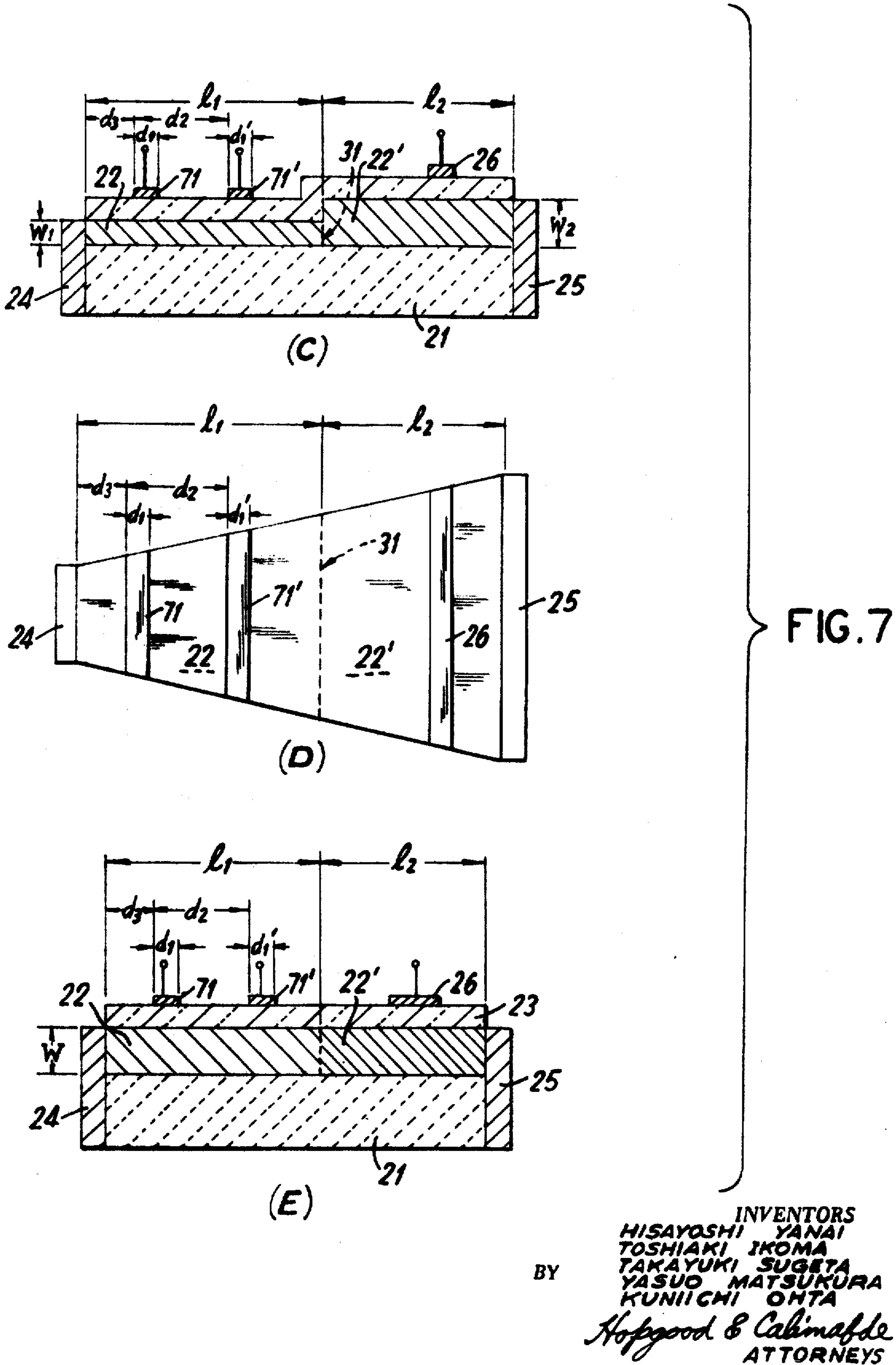

Referring to FIGS. 7(A) and (B), the output electrodes 71 and 71' provided onto the first crystal having the width $a_1$ is grounded via the output load 72. By adjusting the power source 28 to make the electric field within the first crystal 22 smaller than the threshold value $F_{th}$ and larger than the sustaining electric field $F_s$, while the electric field within the second crystal 22' becomes smaller than the sustaining electric field $F_s$, the high field domain produced in the vicinity of the cathode 24 by the trigger pulse from the input electrode 26 propagates toward the anode 25 before is disappears at the boundary face 31. In the course of the propagation, the high field domain passes under the output electrodes 71 and 71'. The output waveform obtained by the output electrode 71 during the period between the generation of the high field domain and its disappearance is shown in FIG. 8(A). The mechanism occurring in this case will be explained referring to FIG. 7(B).

When the high field domain is generated in the vicinity of the cathode, the electric field within the semiconductor crystal 22 that has been uniform up to that time will have a large electric field inside the high field domain and the potential just under the output electrode 71 will be raised. Consequently, the potential of the output electrode 71 is also raised and a pulse current of $-i-\Delta i$ flows across the output load 72, where $-\Delta i$ is the pulse current superimposed due to the trigger. The pulse 81 of FIG. 8(A) is the signal whose rise time depends on the carrier density, being of the order of $10^{-11}$–$10^{-12}$ sec., and the fall time is determined by the resistance of the external circuit and the capacity of the output electrode 71. As the high field domain approaches the output electrode 71 from the left-hand side, passes just under it and goes away to the right-hand side, the potential of the output electrode 71 is dropped when the high field domain is passing under the output electrode 71, and the waveform of the current $i$ flowing through the load 72 changes as the pulse 82 shown in FIG. 8(A) does. The width $t_1$ of this pulse is given by $t_1=d_1/v$ where $d_1$ is the length of the electrode 71 and $v$ is a drift velocity of the high field domain. Here the velocity $v$ is of the order of $10^7$ cm./sec. so that, taking the length of the electrode 71 as 20 microns, $t_1$ is evaluated at $2\times10^{10}$ sec.

The rise time of the pulse 82 obtained from the output electrode 71 shown in FIG. 8(A) is given by dividing the width of the high field domain (about 1μ) by its drift velocity. It is of the order of $10^{-11}$ sec. The fall time is also of the order of $10^{-11}$ sec. By changing the length $d_1$ of the output electrode 20 it is possible to make $t_1$ variable. When the high electric field domain reaches the boundary face 31 between respective crystals 22 and 22', the potential of the first crystal 22 (which has been lowered after the high field domain passed under the output electrode 71) is raised again. Consequently a current pulse 83 of $-i$ is observed from the output electrode 71 in the same direction as the pulse shown in FIG. 8(A). As can be seen from FIG. 8(A), the rise time of the pulse 83 is equal to the time of the pulse 81, and the fall time of the pulse 83 is equal to the rise time of the pulse 81. The period $t_3$ between the rise of the pulse 81 and that of the pulse 82 depends on the distance $d_3$ between the cathode and the output electrode and is given by $d_3/v$.

When the multiplex output electrodes 71 and 71' are provided and grounded through the resistance 72 as shown in FIGS. 7(A) and (B), the output waveform corresponding to FIG. 8(A) is given by FIG. 8(B), and $t_2$ is equal to $d_2/v$ as seen from FIG. 7(A), where $d_2$ is the distance between the output electrodes 71 and 71', and $v$ is the drift velocity of the high field domain. Also, the pulse widths $t_1$, $t_1'$, $t_1''$ . . . are equal to the times obtained by dividing the widths $d_1$, $d_1'$, $d_1''$, . . . by the drift velocity $v$ of the high field domain, respectively. If the output electrodes 71 and 71' are grounded individually through the resistance, then, the waveforms as shown in FIG. 8(A) are obtained individually.

If the output waveforms as shown in FIG. 8(B) are observed through the rectifying diode circuit 73, a waveform such as given by FIG. 8(C) is obtained when the high field domain is produced at the cathode 24 and, after passing through the output electrode 71, disappears at the boundary face 31. The waveform such as given by FIG. 8(D) is obtained when the high field domain passes through the multiple output electrodes connected in parallel. It goes without saying that, if the polarity of the diode is reversed, only the pulse 81 appearing at the time of production of the high field domain and the pulse 82 appearing at the time of disappearance are obtained.

In the above, the explanation has been made about the device shown in FIGS. 7(A) and (B) for the second embodiment. But it is quite evident from the explanation of the first embodiment that the same function can be obtained regarding those shown in FIGS. 7(C) through (E).

Next, referring to FIGS. 9(A) through (H) and according to the third embodiment of this invention, the passage of the high field domain can be prevented by providing the second semiconductor crystal 22' having a large cross-sectional area or a large carrier density with the output electrode 71 as previously explained in the first and the second embodiments. The second crystal region 22' is aimed at making the output electrode 71 capable of producing only the output pulse accompanied by the potential variations at the times of generation and disappearance of the high field domain. The output pulses obtained by the device of FIG. 9 are the rising and dropping pulses at the times of generation and disappearance of the high field domain and hence the pulse widths $t$ are extremely narrow, being of the order of $10^{-11}$–$10^{-12}$ sec.

Since in the samples shown in FIGS. 9(A) through (H) the high field domain do not pass under the output electrodes, the feedback to the output circuit does not occur. FIGS. 9(A), (B), (C) and (D) represent the cases when the output electrode 71 is located at the second crystal 22' whose electric field is smaller than the sustaining field $F_s$, and FIGS. 9(E), (F), (G) and (H) represent the cases where the input electrode 26 and the output electrode 71 are both located at the second crystal 22' where the electric field of the semiconductor crystal is small. The working principle of these devices are similar to those shown in FIGS. 9(A), (B), (C) and (D), while another common principle is also applicable to for the devices shown in FIGS. 9(E), (F), (G) and (H). Then, explanation will be made referring to FIGS. 9(A) and (E).

As was explained in the above embodiments and that shown in FIG. 8(A), when the high field domain is generated in the vicinity of the cathode 24, a part of the signal such as shown in FIG. 8(A) is obtained at the output electrode 71. In the devices of FIGS. 9(A) through (D), the high field domain is generated spontaneously by setting on the electric field of the first crystal 22 over the threshold $F_{th}$. As a result, the amplitudes of pulses 81' and 83 of FIG. 8(A) at the times of generation and disappearance of the high field domain are equal because each of the electrode 71 of the devices does not accept the trigger effect as the devices shown in FIGS. 8(A) and (B) do. More particularly, the high field domain gives a signal corresponding to the pulse 81' of FIG. 9(A) to the output electrode 71. Since the high field domain propagates only in the crystal 22 of large electric field intensity and since the electric field in the crystal 22' where the output electrode 71 exists is below the sustaining electric field $F_s$, the high field domain disappears at the boundary face 31 and does not reach the output electrode 71. In other words, the pulse signal 82 of FIG. 8(A) is not observed. The waveforms observed at the output electrodes of FIGS. 9(A) to (D) are those of the output pulse shown in FIG. 10(A). On the other hand, referring to FIG. 9(E), the production of the high field domain is controlled by the trigger pulse supplied from the input electrode 26, so that the pulses 81 and 83 of the waveforms shown in FIG. 10(B) may be obtained at the time of generation and disappearance of the high field domain, and that the devices of FIGS. 9(E) to (H) may enable the same function to take place simultaneously. The pulse interval obtained in the devices of FIGS. 9(A) to (H) corresponds to $l_1/v$.

The present invention so far explained in detail has the most significant characteristic such that the high field domain does not pass under the supplementary electrode, the input electrode, or the output electrode. This characteristic prevents beforehand the feedback of the output produced by the passage of the high field domain under the input electrode and is strikingly effective for avoiding the malfunction as a switching element or as a pulse generating element.

Furthermore, the invention enables us to obtain, a high-speed output pulse by avoiding the passage of the high field domain just under the output electrode.

In the above embodiments of this invention, the supplementary electrodes such as input and output electrodes etc. can be set up in an arbitrary number, and are not always connected to the semiconductor crystal through insulating materials such as silicon oxide, silicon nitrode, aluminum oxide, but the connection can be attained through pn junctions or direct couples ohmic contacts.

The semiconsuctor region for forming the high field domain may be supported by itself using a unitary bar of n-type GaAs, or supported by another semiconductor material, such as germanium, silicon, or a certain compound semiconductor on which the semiconductor region can be grown. Although this invention enables us to obtain, as described in detail, a switching element by taking the gallium arsenide as an example exhibiting the Gunn effect, the same is true also for other semiconductor crystals exhibiting the Gunn effect. Moreover, this invention can be applied to all of bulk effect device, oscillation phenomena caused by the production of the high field domain generated by the supersonic amplifying effect of piezoelectric semiconductors such as cadmium sulfide that produce the high field domain. Otherwise, a germanium device whose oscillation phenomenon is based on the trapping center may be used.

We claim:

1. A semiconductor switching element comprising a semiconductor crystal capable of exhibiting a bulk negative resistance characteristic, anode and cathode electrodes in ohmic contact with said crystal, said semiconductor crystal comprising a high electric field sustaining portion adjacent the cathode and a low electric field sustaining portion adjacent the anode, triggering means operatively coupled to the low electric field sustaining portion to raise the electric field in the high field portion to a level sufficient to initiate a high field domain drifting from the cathode to the low electric field portion adjacent the anode, output means operatively coupled to the crystal to provide an output signal representative of the high field domain, and means for applying a bias potential across the anode and cathode of a magnitude sufficient to bias the electric field in the high field portion to a level for sustaining high field domains but not initiate said domains and with the crystal being chosen to provide an electric field in the low field portion to a level below that necessary for sustaining a high field domain, and means for generating a trigger voltage and applying said voltage to the triggering electrode with an magnitude sufficient to initiate a high field domain in the high field portion but sufficiently low to prevent the formation of a high field domain in the low field portion of the crystal, thereby to cause said initiated high field domain to drift into the low field sustaining portion of the crystal.

2. The device as recited in claim 1 wherein said output means comprises an output electrode capacitively coupled to the low electric field portion of the crystal.

3. The device as recited in claim 1 wherein said output means comprises an output electrode operatively coupled to said anode.

4. The device as recited in claim 1, wherein said crystal is formed of a high electric field sustaining high resistivity semiconductor material adjacent the cathode and a low electric field sustaining low resistivity semiconductor material adjacent the anode and in abutting contact with the high resistivity material.

5. The device as recited in claim 1, wherein said crystal is T-shaped, with the wide cross-section and narrow cross-section portions forming said low and high electric sustaining portions, respectively.

References Cited

UNITED STATES PATENTS

| | | | |
|---|---|---|---|
| 3,365,583 | 1/1968 | Gunn | 317—234 |
| 3,377,566 | 4/1968 | Lanza | 317—234 |
| 3,434,008 | 3/1969 | Sandbank | 317—234 |
| 3,439,236 | 4/1969 | Blicher | 317—234 |

OTHER REFERENCES

Proceeding of the IEEE, "Bulk Semiconductor High-Speed Current Waveform Generator," by Shoji, May 1967, pp. 720, 721.

JERRY D. CRAIG, Primary Examiner

U.S. Cl. X.R.

331—107